(12) United States Patent
Noh et al.

(10) Patent No.: US 8,241,934 B2
(45) Date of Patent: Aug. 14, 2012

(54) DISPLAY SUBSTRATE AND METHOD OF MANUFACTURING THE SAME

(75) Inventors: Jung-Hun Noh, Yongin-si (KR);
Myung-Hwan Kim, Yongin-si (KR);
Seung-Hwan Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/397,631

(22) Filed: Feb. 15, 2012

(65) Prior Publication Data

US 2012/0142126 A1 Jun. 7, 2012

Related U.S. Application Data

(62) Division of application No. 12/575,308, filed on Oct. 7, 2009, now Pat. No. 8,138,503.

(30) Foreign Application Priority Data

Oct. 8, 2008 (KR) .................... 10-2008-0098648

(51) Int. Cl.
*H01L 21/00* (2006.01)

(52) U.S. Cl. .................. 438/29; 438/23; 438/34

(58) Field of Classification Search .............. 438/23, 438/29, 34, 35, 44
See application file for complete search history.

(56) References Cited

U.S. PATENT DOCUMENTS

| | | | |
|---|---|---|---|
| 6,525,403 B2 | 2/2003 | Inaba et al. | |
| 6,573,169 B2 | 6/2003 | Noble et al. | |
| 7,144,751 B2 | 12/2006 | Gee et al. | |
| 7,148,541 B2 | 12/2006 | Park et al. | |
| 7,172,943 B2 | 2/2007 | Yeo et al. | |
| 7,326,608 B2 | 2/2008 | Lee et al. | |
| 7,348,246 B2 | 3/2008 | Kim et al. | |
| 7,511,358 B2 | 3/2009 | Choi et al. | |
| 7,749,786 B2 * | 7/2010 | Wells ................ | 438/44 |
| 7,811,890 B2 | 10/2010 | Hsu et al. | |
| 7,859,065 B2 | 12/2010 | Takeuchi et al. | |
| 7,863,683 B2 | 1/2011 | Kim et al. | |
| 2005/0263801 A1 | 12/2005 | Park et al. | |
| 2007/0252240 A1* | 11/2007 | Andresen et al. ........ | 257/607 |
| 2008/0029828 A1 | 2/2008 | Oh et al. | |
| 2008/0303079 A1 | 12/2008 | Cho et al. | |
| 2010/0270619 A1 | 10/2010 | Lee | |

FOREIGN PATENT DOCUMENTS

| | | |
|---|---|---|
| KR | 10-2004-0012207 A | 2/2004 |
| KR | 10-2006-0064318 A | 6/2006 |

* cited by examiner

*Primary Examiner* — Kevin M Picardat
(74) *Attorney, Agent, or Firm* — Innovation Counsel LLP

(57) ABSTRACT

A display substrate includes a base substrate, a barrier pattern, a source electrode, a drain electrode, a semiconductor layer, an insulating layer, and a gate electrode. The barrier pattern protrudes from the base substrate. The source and gate electrodes are formed adjacent to opposite sides of the barrier pattern on the base substrate. The semiconductor layer is provided on the barrier pattern to connect the source electrode with the drain electrode, and the insulating layer covers the semiconductor layer, the source electrode, and the drain electrode. The gate electrode is provided on the insulating layer, and is overlapped with the semiconductor layer.

8 Claims, 12 Drawing Sheets

DISPLAY SUBSTRATE AND METHOD OF MANUFACTURING THE SAME

CROSS-REFERENCE TO RELATED APPLICATION

This application is a divisional of U.S. patent application Ser. No. 12/575,308 filed on Oct. 7, 2009, which claims priority to and the benefit of Korean Patent Application No. 2008-98648 filed on Oct. 8, 2008. Both applications are hereby incorporated by reference for all purposes as if fully set forth herein.

BACKGROUND

1. Field of the Invention

The present invention relates to a display substrate and a method of manufacturing the same. More particularly, the present invention relates to a display substrate capable of reducing leakage current and a method of manufacturing the display substrate.

2. Description of the Related Art

Researches on flexible thin film transistor (TFT) display substrates have been actively carried out. A flexible TFT display substrate employs soluble TFTs such as organic TFTs and oxide TFTs which are suitable for printing processes or ink jet processes.

Soluble TFTs are classified into top-gate type TFTs having a gate electrode provided on a semiconductor layer and bottom-gate type TFTs having a gate electrode provided below a semiconductor layer. A top-gate type TFT may have a structure in which source and drain electrodes are provided below a channel to be connected to the channel. In such a soluble TFT, current may leak through the channel without an off-operation of the gate electrode.

SUMMARY

Therefore, an exemplary embodiment of the present invention provides a display substrate capable of reducing leakage current of a thin film transistor.

Another exemplary embodiment of the present invention provides a method of manufacturing the display substrate.

In an exemplary embodiment of the present invention, the display substrate includes a base substrate, a barrier pattern, a source electrode, a drain electrode, a semiconductor layer, an insulating layer, and a gate electrode. The barrier pattern protrudes from the base substrate. The source electrode is adjacent to a first side of the barrier pattern on the base substrate. The drain electrode is adjacent to a second side of the barrier pattern on the base substrate. The semiconductor layer is provided on the barrier pattern to connect the source electrode with the drain electrode. The insulating layer covers the semiconductor layer, the source electrode, and the drain electrode. The gate electrode is provided on the insulating layer and overlaps the semiconductor layer.

The barrier pattern is integrally formed with the base substrate.

The barrier pattern may have a thickness equal to or greater than the thicknesses of the source and drain electrodes.

In another exemplary embodiment of the present invention, a method of manufacturing the display substrate is performed as follows.

A barrier pattern is formed on a base substrate. Source and drain electrodes are formed adjacent to two side surfaces of the barrier pattern. Then, a semiconductor layer is formed on the barrier pattern, contacting the source and drain electrodes, and an insulating layer is formed on the source electrode, the drain electrode, and the semiconductor layer. Thereafter, a gate electrode is formed on the insulating layer such that the gate electrode overlaps the semiconductor layer. After forming a protective layer on both the insulating layer and the gate electrode, a pixel electrode is formed on the protective layer to be electrically connected to the drain electrode.

The barrier pattern is formed by patterning a portion of the base substrate.

As described above, the barrier pattern protruding from the base substrate can block current leakage between source and drain electrodes.

The barrier pattern protruding from the base substrate and provided between the source and drain electrodes can be integrally formed with the base substrate, or may be formed on the base substrate by using an insulating material.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
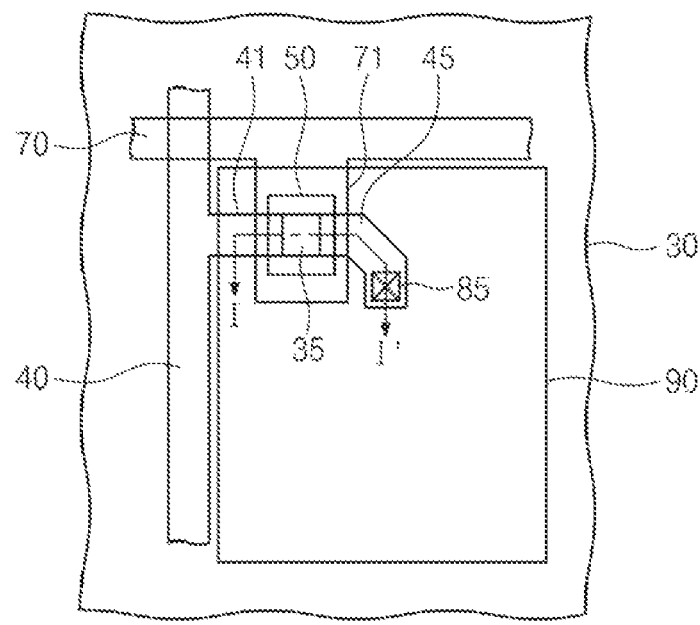
FIG. 1 is a plan view showing a display substrate according to an exemplary embodiment of the present invention.

Hereinafter, preferred embodiments of a display substrate and a method of manufacturing the same will be described in detail with reference to accompanying drawings. However, the scope of the present invention is not limited to such embodiments and the present invention may be realized in various forms. The embodiments to be described below are provided to fully disclose the present invention and enable those skilled in the art to understand the present invention. The size of layers and regions shown in the drawings may be simplified or magnified for clarity of explanation. Same reference numerals are used to designate same elements throughout the drawings.

Figure 2:
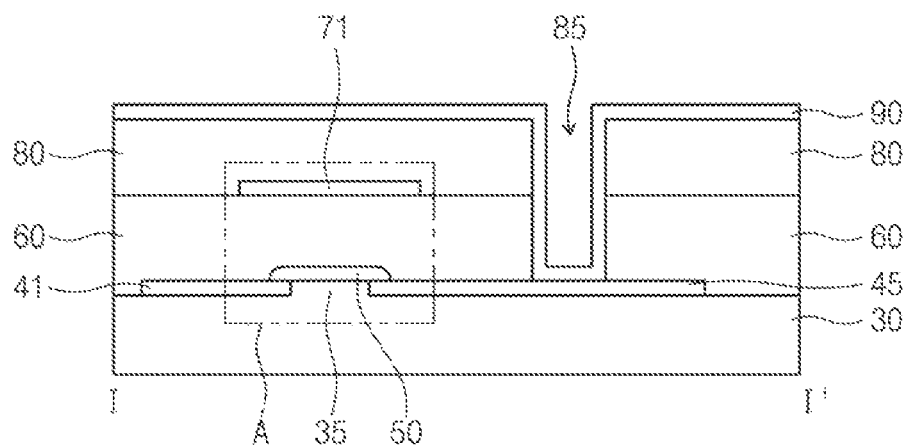
FIG. 2 is a cross-sectional view taken along line I-I' shown in FIG. 1.
Figure 3:
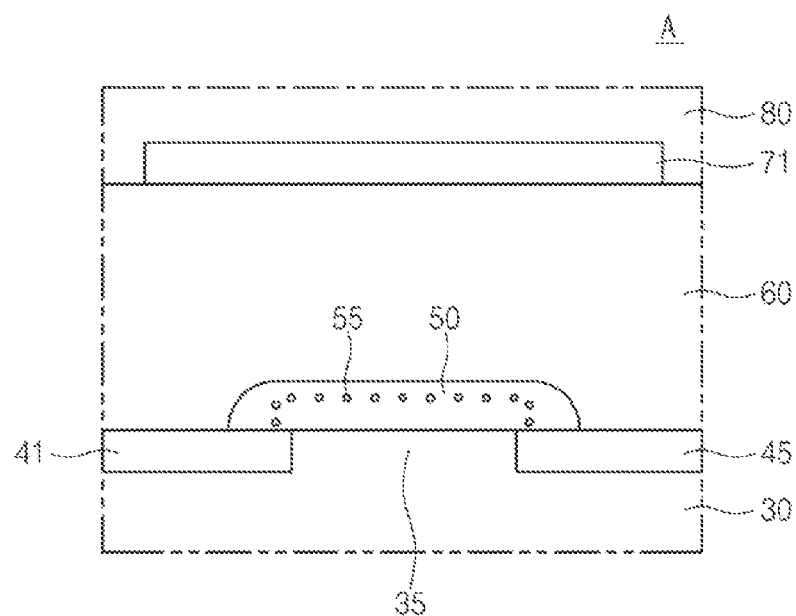
FIG. 3 is an enlarged view of region A of FIG. 2.

FIG. 1 is a plan view of a display substrate 10 according to an exemplary embodiment of the present invention, and FIG. 2 is a cross-sectional view taken along line I-I' shown in FIG. 1. FIG. 3 is an enlarged view of region A of FIG. 2.

Referring to FIGS. 1, 2, and 3, the display substrate 10 includes a base substrate 30, a barrier pattern 35, a source electrode 41, a drain electrode 45, a semiconductor layer 50, an insulating layer 60, a gate electrode 71, a protective layer 80, and a pixel electrode 90.

The base substrate 30 comprises a flexible and insulating polymer. The base substrate 30 includes a flexible substrate that is transparent and thin. The base substrate 30 may comprise polyethylene terephthalate, polyethersulphone, polyetheretherketone, polyetherimide, polyimide, polyethyelene naphthalate, polycarbonate, or fiberglass reinforced plastics.

The barrier pattern 35 protrudes from the base substrate 30. The barrier pattern 35 is integrally formed with the base substrate 30. The barrier pattern 35 is formed by removing a predetermined thickness from a remaining region of the base substrate 30 except for a portion thereof. For example, the barrier pattern 35 may be formed by depositing an insulating materials such as silicon nitride (SiNx) and silicon oxide (SiOx) on the base substrate 30 and then patterning the insulating material. Alternatively, the barrier pattern 35 may be an insulator stacked on the base substrate 30 through a lamination process.

The barrier pattern 35 may have a thickness greater or equal to the thicknesses of the source and drain electrodes 41 and 45 to prevent leakage current from flowing between the source and drain electrodes 41 and 45.

The source electrode 41 branches from a data line 40 extending in a first direction of the base substrate 30, and is provided in the vicinity of a first side of the barrier pattern 35 on the base substrate 30. For example, the source electrode 41 may make contact with the first side surface of the barrier pattern 35. The source electrode 41 may have a thickness similar to the thickness of the barrier pattern 35.

The drain electrode 45 is provided in the vicinity of a second side of the barrier pattern 35 on the base substrate 30. The drain electrode 45 may make contact with the second side surface of the barrier pattern 35. The drain electrode 45 may have a thickness similar to that of the source electrode 41.

The semiconductor layer 50 is provided on the barrier pattern 35, the source electrode 41, and the drain electrode 45. The semiconductor layer 50 may include a low molecular organic substance such as oligothiophene or pentacene, or a high molecular organic substance such as polythiophene. In addition, the semiconductor layer 50 may include oxide such as titanium dioxide ($TiO_2$), tin oxide ($SnO_2$), silicon dioxide ($SiO_2$), copper oxide (CuO), zinc oxide (ZnO), zinc titanate (ZnTiO3), and aluminum oxide ($Al_2O_3$). The semiconductor layer 50 is electrically connected to the source and drain electrodes 41 and 45. The semiconductor layer 50 provides a moving passage for charges 55 between the source and drain electrodes 41 and 45 as shown in FIG. 3. The charges 55 move on the barrier pattern 35 between the source and drain electrodes 41 and 45. In the absence of the barrier pattern 35, the charges 55 would move between the source and drain electrodes 41 and 45 close to the base substrate 30, and would not react with the control of the gate electrode 71.

The insulating layer 60 covers the base substrate 30, the semiconductor layer 50, the source electrode 41, and the drain electrode 45. The insulating layer 60 may include an insulating material such as silicon nitride (SiNx) or silicon oxide (SiOx).

The gate electrode 71 is formed on the insulating layer 60 and overlapped with the semiconductor layer 50. The gate electrode 71 branches from a gate line 70 and crosses the data line 40. The gate line 70 extends in a second direction perpendicular to the first direction. The gate electrode 71 forms a thin film transistor with the source electrode 41, the drain electrode 45, and the semiconductor layer 50.

The protective layer 80 covers the gate electrode 71 and the insulating layer 60. The protective layer 80 insulates the gate electrode 71 and protects the gate electrode 71 from external shocks. The protective layer 80 includes a contact hole 85 exposing a portion of the drain electrode 45. The contact hole 85 exposes a portion of the drain electrode 45 by etching a portion of the protective layer 80 and the insulating layer 60.

The pixel electrode 90 is provided on the protective layer 80, and is connected to the drain electrode 45 through the contact hole 85. The pixel electrode 90 may include a transparent conductive material such as indium tin oxide (ITO) or indium zinc oxide (IZO).

Although not shown in FIG. 1, the display substrate 10 further includes a buffer layer provided on the base substrate 30. The buffer layer planarizes the surface of the base substrate 30, and prevents the surface of the base substrate 30 from being damaged by external force. In addition, the buffer layer prevents gas from being discharged from the base substrate 30, and prevents moisture or oxygen from infiltrating into the source electrode 41, the drain electrode 45, and the semiconductor layer 50.

Figure 4:
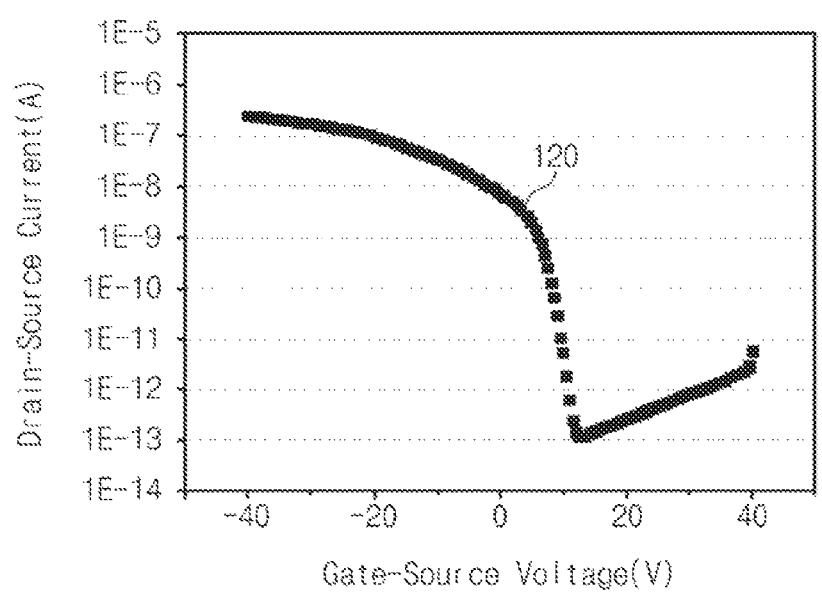
FIG. 4 is a graph showing a current-voltage characteristic of a display substrate according to an exemplary embodiment of the present invention.

Hereinafter, a current-voltage characteristic of the display substrate 10 according to an exemplary embodiment of the present invention is described in more detail. FIG. 4 is a graph showing the current-voltage characteristic of the display substrate 10 according to an exemplary embodiment of the present invention.

In the graph of FIG. 4, the X axis represents a voltage (hereinafter, referred to as "gate driving voltage") of an electric field formed between the gate electrode 71 and the source electrode 41, and the Y axis represents a current (hereinafter, referred to as "driving current") which flows between the source electrode 41 and the drain electrode 45. A curve 120 is obtained by providing the barrier pattern 35 between the source and drain electrodes 41 and 45 when the source electrode 41, the drain electrode 45, the semiconductor layer 50, and the gate electrode 71 form a PMOS structure.

The curve 120 shows that when the gate driving voltage of about 10V or less is applied, the driving current of about 1E-9 A or more flows between the source electrode 41 and the drain electrode 45. In addition, when the gate driving voltage of about 13V or more is applied, the curve 120 shows that the driving current in the range of about 1E-13 A to about 1E-11 A flows between the source electrode 41 and the drain electrode 45. The curve 120 shows that the driving current does not leak between the source electrode 41 and the drain electrode 45 when the gate driving voltage has an off level. Accordingly, the curve 120 shows that the leakage current is reduced between the source electrode 41 and the drain electrode 45 by the barrier pattern 35.

Hereinafter, a method of manufacturing the display substrate 10 according to one embodiment of the present invention is described with reference to FIGS. 5 to 22.

FIGS. 5 to 22 are views showing a method of manufacturing the display substrate 10 according to an exemplary embodiment of the present invention.

Figure 5:
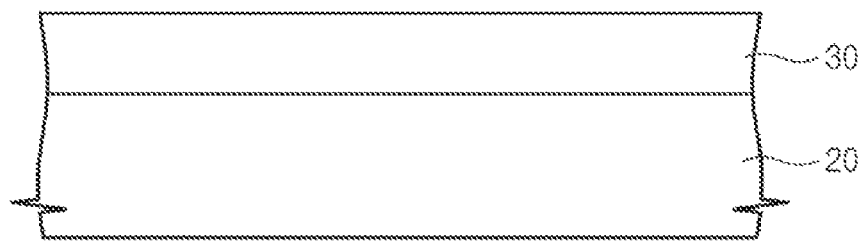
FIGS. 5 to 22 are views showing a method of manufacturing a display substrate according to an exemplary embodiment of the present invention.

Referring to FIG. 5, the base substrate 30 is bonded to a carrier substrate 20. The base substrate 30 is prepared. The base substrate 30 includes polyethylene terephthalate, polyethersulphone, polyetheretherketone, polyetherimide, polyimide, polyethyelene napthalate, polycarbonate, or fiberglass reinforced plastics. The base substrate 30 may be formed through a spin coating method. Then, the carrier substrate 20 including glass is prepared. Thereafter, an adhesion agent, for example one or more adhesives selected from epoxy resins, urethane resins or acryl resins, is applied between the base substrate 30 and the carrier substrate 20 so that the base substrate 30 is bonded to the carrier substrate 20. The carrier substrate 20 is bonded to the base substrate 30 such that the base substrate 30 including a flexible material which can be easily handled.

Figure 6:
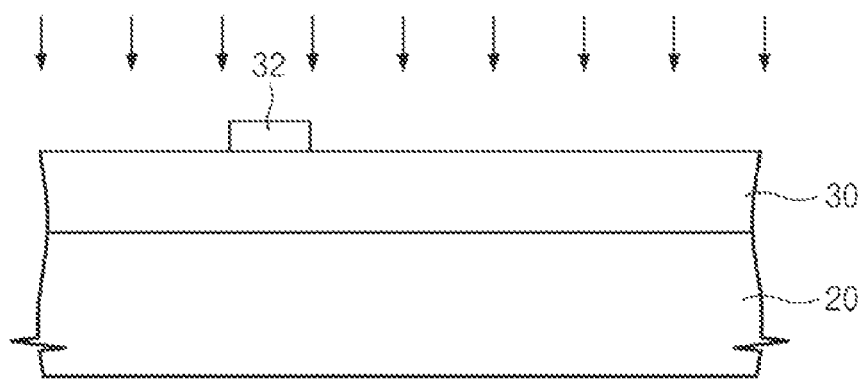
Figure 7:
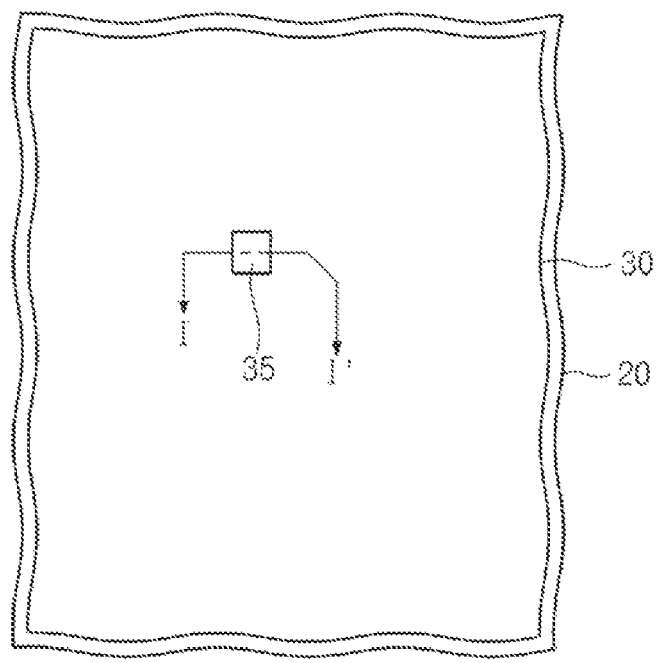
Figure 8:
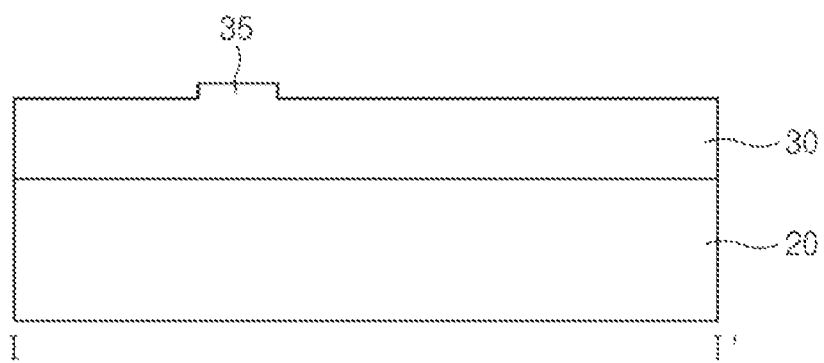

Subsequently, referring to FIGS. 6, 7, and 8, the barrier pattern 35 is formed on the base substrate 30. A photoresist material is deposited on the base substrate 30 to form a photoresist layer 32. The photoresist layer 32 is patterned in a predetermined pattern through a photolithography process. Thereafter, the base substrate 30 is etched through a dry etch method employing oxygen (O2) gas, thereby forming the barrier pattern 35 which overlaps the photoresist layer 32. Then, the photoresist layer 32 is removed.

Figure 9:
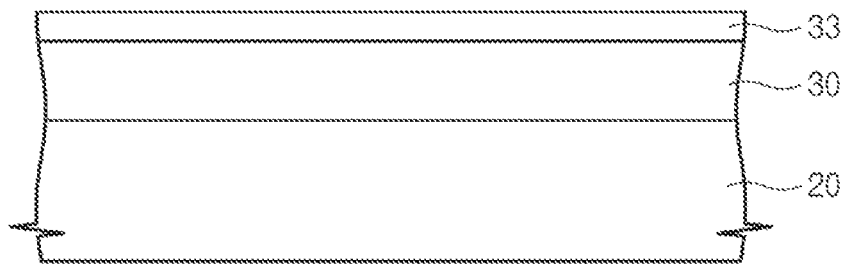
Figure 10:
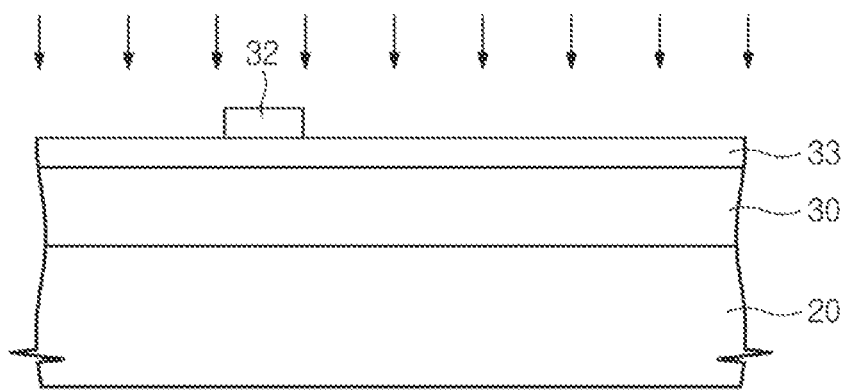
Figure 11:
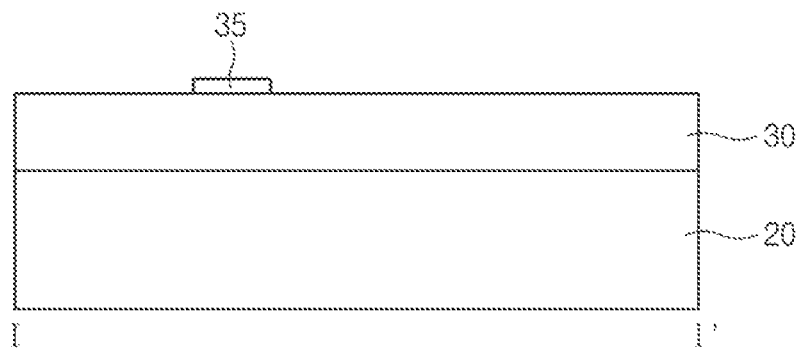

Alternatively, the barrier pattern 35 may be formed on the base substrate 30 according to a method shown in FIGS. 9 to 11. In detail, an insulating material is deposited on the base substrate 30, thereby forming a coating layer 33. The coating layer 33 may include polyimide, silicon nitride (SiNx), or silicon oxide (SiOx). Thereafter, a photoresist material is deposited on the coating layer 33 to form the photoresist layer 32. Then, the photoresist layer 32 is patterned to a predetermined pattern through a photolithography process. Subsequently, the coating layer 33 is etched to form the barrier pattern 35. Then, the photoresist layer 32 is removed.

Although not shown in the figures, the barrier pattern 35 may be formed on the base substrate 30 through lamination. For example, an insulator is attached to a roller, and the insulator is laminated on the surface of the base substrate 30 through the roller to form the barrier pattern 35.

Figure 12:
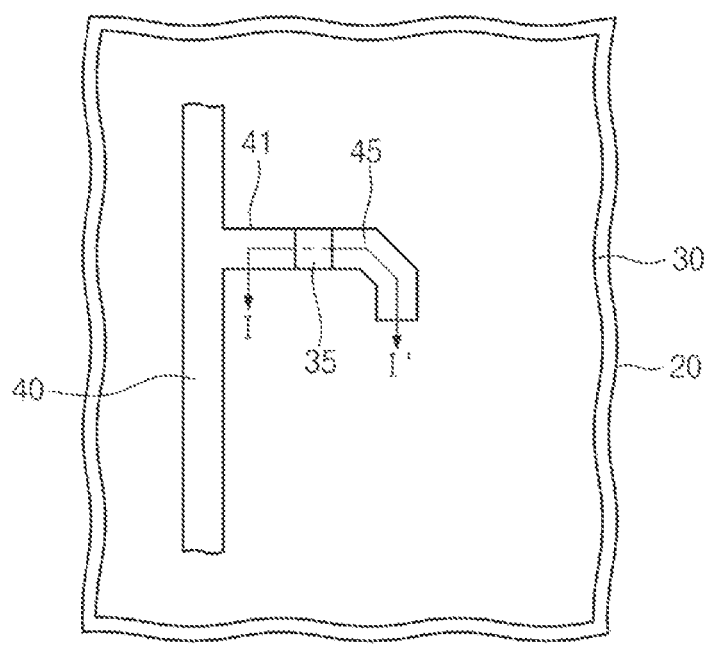
Figure 13:
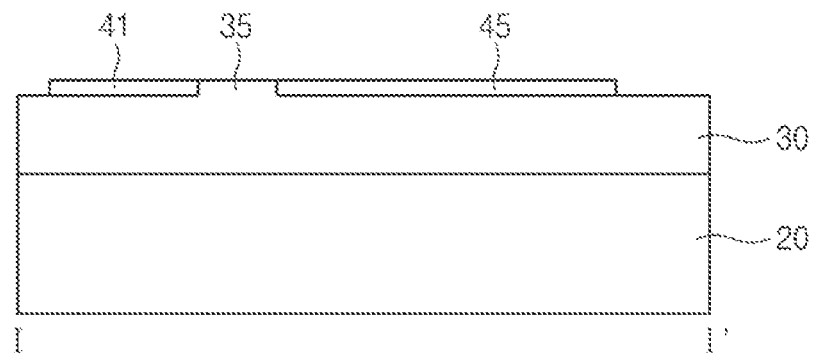

Referring to FIGS. 12 and 13, the data line 40, the source electrode 41, and the drain electrode 45 are formed on the base substrate 30. In detail, one of molybdenum (Mo), copper (Cu), silver (Ag), aluminum (Al), and alloy thereof is deposited on the base substrate 30 to form a data metal layer. The data metal layer is patterned through a photolithography process to form the data line 40 extending in the first direction, the source electrode 41 branching from the data line 40, and the drain electrode 45 spaced apart from the source electrode 41. The source electrode 41 is adjacent to one side of the barrier pattern 35, and the drain electrode 45 is adjacent to the other side of the barrier pattern 35. The data metal layer on the barrier pattern 35 may be removed such that the source electrode 41 and the drain electrode 45 make contact with opposite side surfaces of the barrier pattern 35, respectively.

Figure 14:
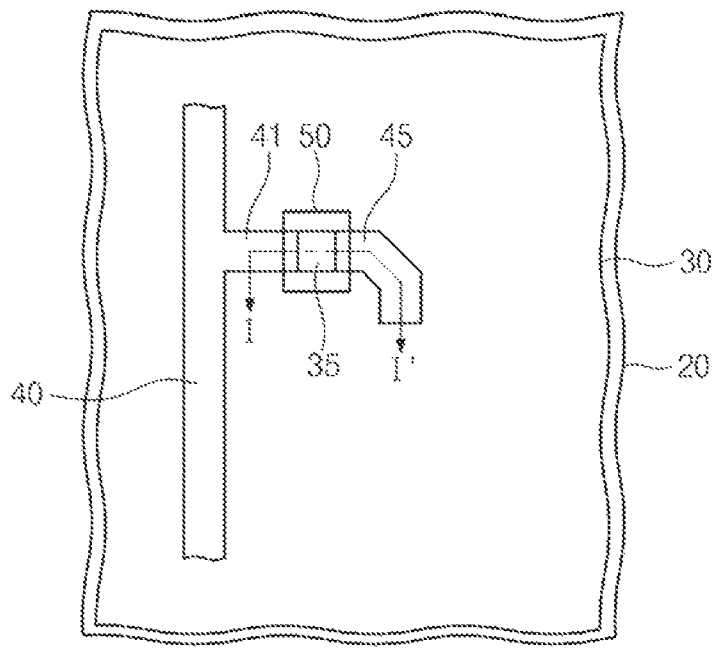
Figure 15:
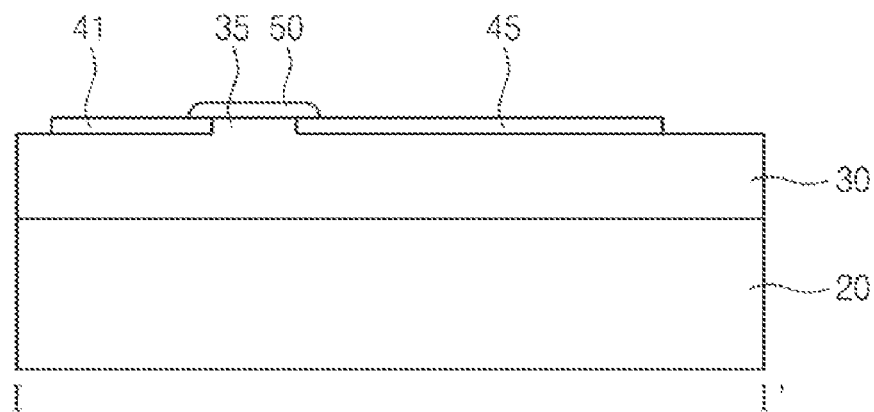

Referring to FIGS. 14 and 15, the semiconductor layer 50 is formed on the barrier pattern 35. In this case, a semiconductor material is dropped through an ink jet method to form the semiconductor layer 50. For example, one selected from low molecular organic substances, high molecular organic substances, and oxides is dropped on the barrier pattern 35 to form the semiconductor layer 50 which contacts the source and drain electrodes 41 and 45. The semiconductor material may be dropped after a separator provided with a hole to expose portions of the source and drain electrodes 41 and 45 and the barrier pattern 35 is formed on the base substrate 30, the source electrode 41, and the drain electrode 45

Figure 16:
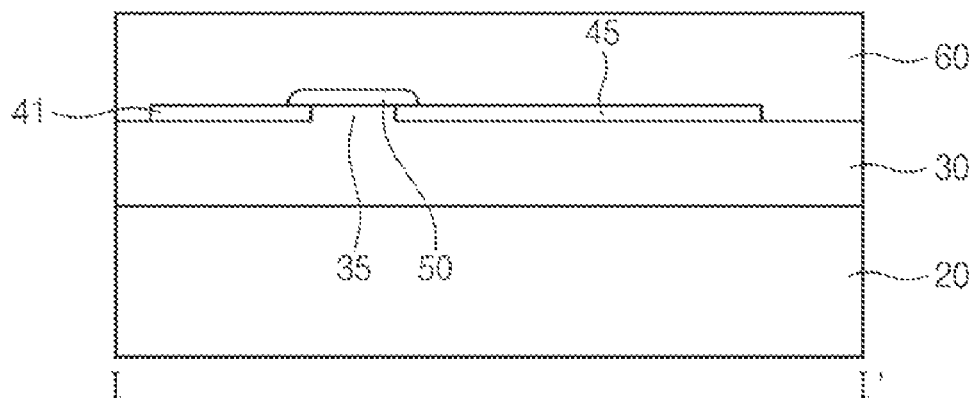

Thereafter, referring to FIG. 16, the insulating layer 60 including an inorganic material is formed on the source electrode 41, the drain electrode 45, and the semiconductor layer 50. The insulating layer 60 may include silicon nitride (SiNx) or silicon oxide (SiOx).

Figure 17:
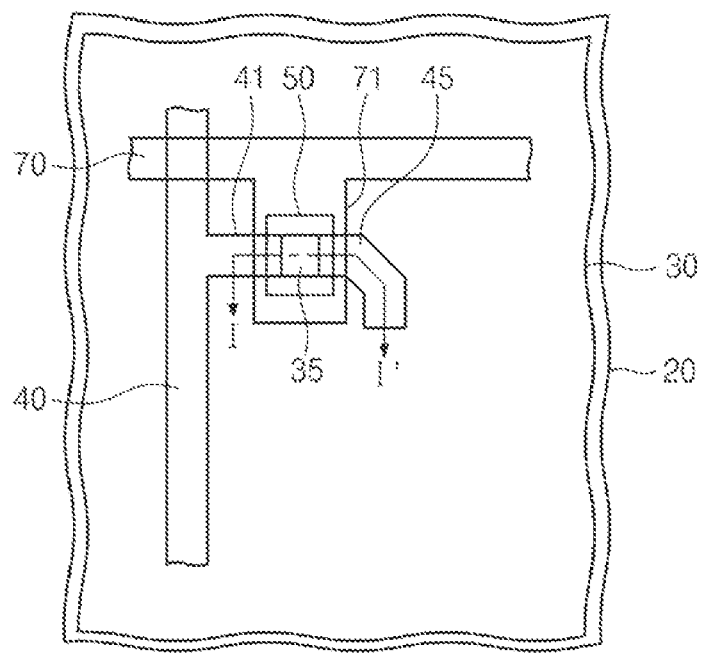
Figure 18:
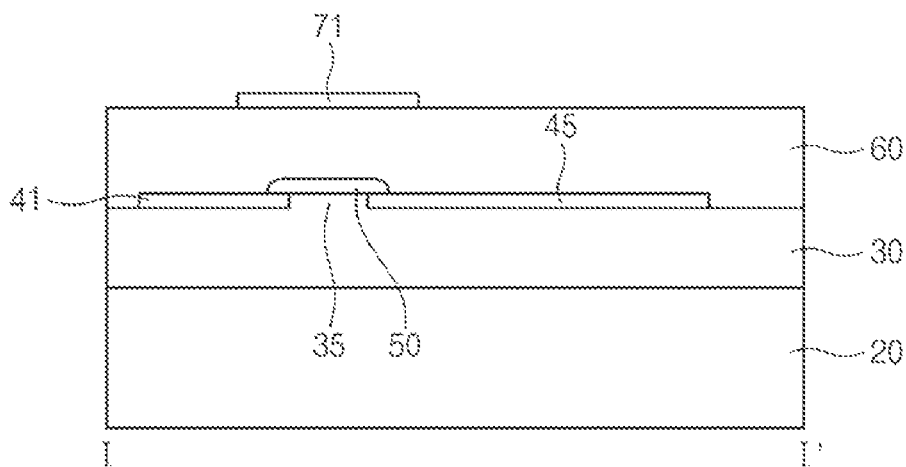

Referring to FIGS. 17 and 18, the gate line 70 and the gate electrode 71 are formed on the insulating layer 60. The gate line 70 extends in the second direction, perpendicular to the first direction, and crosses the data line 40. The gate electrode 71 branches from the gate line 70, and overlaps the semiconductor layer 50. The gate line 70 and the gate electrode 71 may be formed through a metal printing process. For example, a gravure printing device is provided on the insulating layer 60 and a metal pattern corresponding to the gate line 70 and the gate electrode 71 is attached to the surface of the gravure printing device. Thereafter, the metal pattern is printed on the surface of the insulating layer 60 by using the gravure printing device, thereby forming the gate line 70 and the gate electrode 71.

Figure 19:
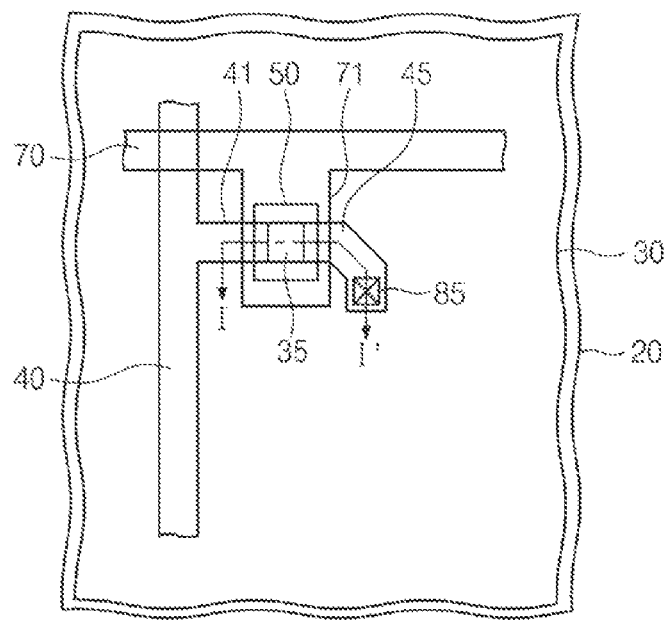
Figure 20:
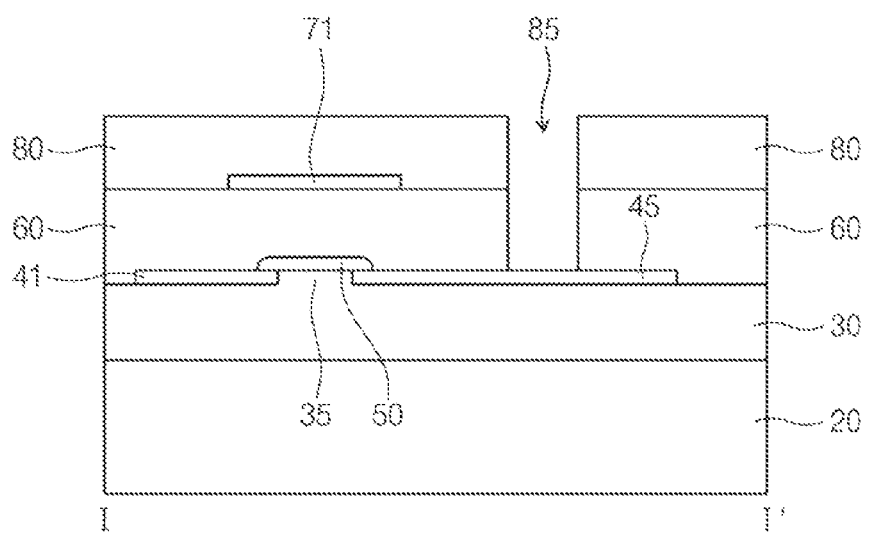

Referring to FIGS. 19 and 20, an organic material or an inorganic material is deposited on the insulating layer 60, the gate line 70, and the gate electrode 71 to form the protective layer 80. Thereafter, a portion of the insulating layer 60 and a portion of the protective layer 80, which is overlapped by a portion of the drain electrode 45, are removed to form the contact hole 85. The contact hole 85 exposes a portion of the drain electrode 45.

Figure 21:
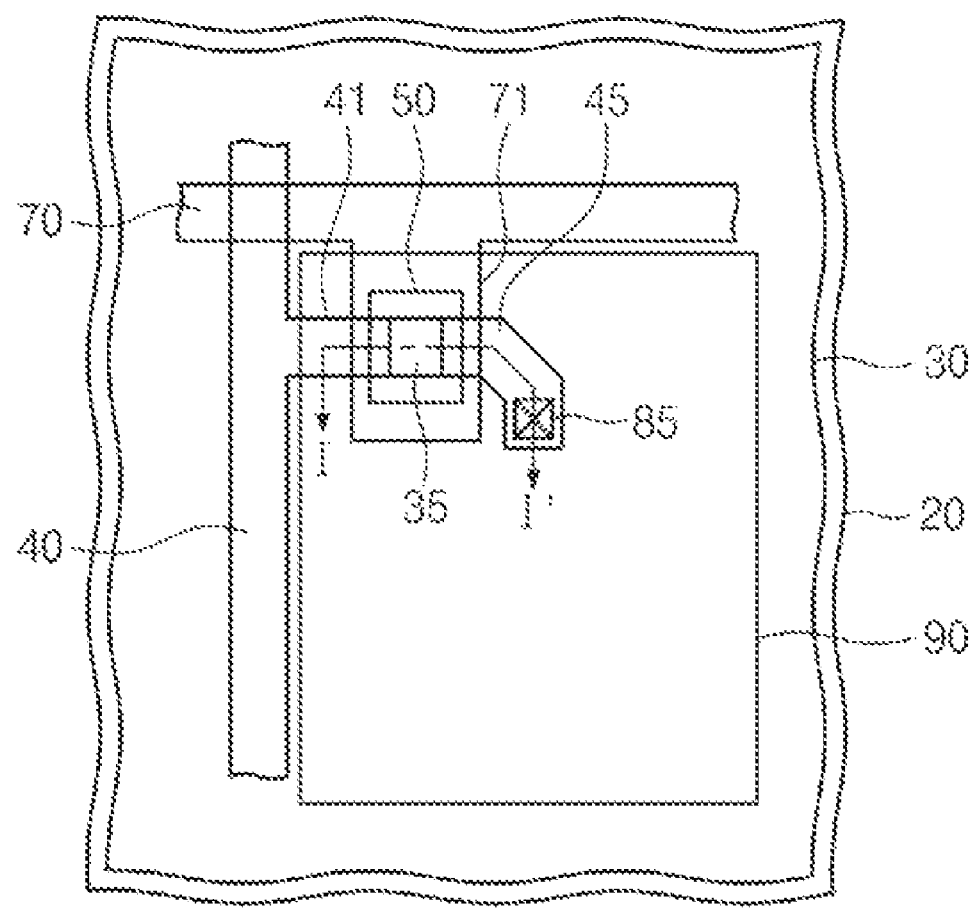
Figure 22:
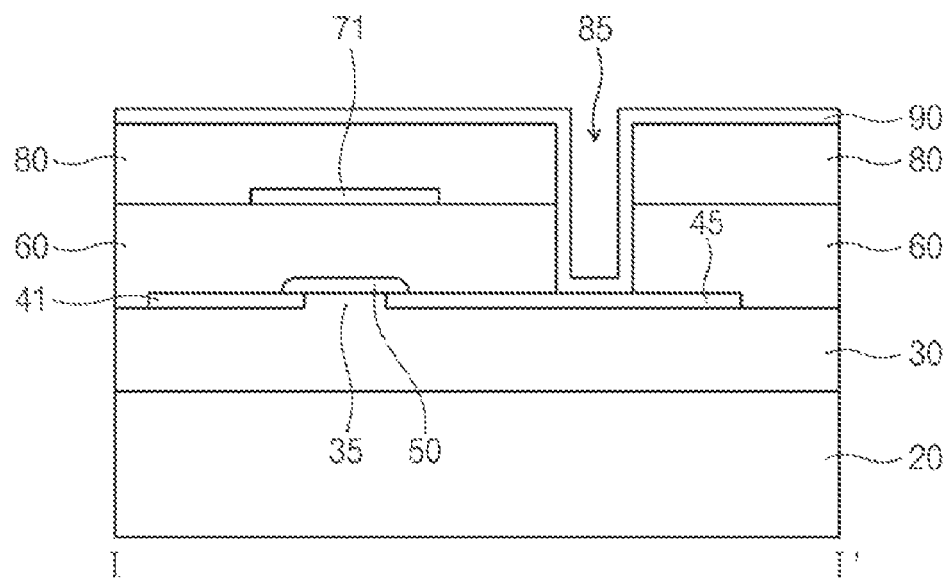

Referring to FIGS. 21 and 22, the pixel electrode 90 including a transparent conductive material is formed on the protective layer 80. In detail, one of indium tin oxide (ITO) and indium zinc oxide (IZO) is deposited on the protective layer 80 and then patterned to form the pixel electrode 90 that contacts the drain electrode 45 through the contact hole 85.

In the method of manufacturing the display substrate described above, a buffer layer may be further formed on the base substrate 30 before the data line 40, the source electrode 41, and the drain electrode 45 are formed. In detail, silicon nitride (SiNx) is deposited on the base substrate 30 and the barrier pattern 35 to form the buffer layer. The buffer layer formed on the barrier pattern 35 is then removed. The buffer layer planarizes the surface of the base substrate 30, and prevents the surface of the base substrate 30 from being damaged. In addition, the buffer layer prevents moisture or oxygen (O2) from infiltrating into the surface of the base substrate 30.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a display substrate, the display substrate comprising:
   forming a barrier pattern on a base substrate;
   forming a source electrode and a drain electrode each adjacent to a side surface of the barrier pattern;
   forming a semiconductor layer on the barrier pattern to make contact with the source and drain electrodes;
   forming an insulating layer on the source electrode, the drain electrode, and the semiconductor layer;
   forming a gate electrode on the insulating layer such that the gate electrode is overlapped with the semiconductor layer;
   forming a protective layer on both the insulating layer and the gate electrode; and
   forming a pixel electrode on the protective layer to be electrically connected to the drain electrode.

2. The method of claim 1, wherein the barrier pattern is formed by patterning a portion of the base substrate.

3. The method of claim 2, wherein the base substrate comprises a flexible material.

4. The method of claim 1, wherein the barrier pattern is formed by depositing an insulating material on the base substrate and patterning the insulating material.

5. The method of claim 1, wherein the barrier pattern is formed by bonding an insulator to the base substrate through lamination.

6. The method of claim 1, wherein the semiconductor layer is formed by dropping a semiconductor material on the barrier pattern.

7. The method of claim 1, wherein the gate electrode is formed by printing a metal pattern on the insulating layer.

8. The method of claim 1, further comprising bonding the base substrate to a carrier substrate, before forming the barrier pattern.

* * * * *